United States Patent
Liaw (10) Patent No.: US 9,634,013 B2
(45) Date of Patent: Apr. 25, 2017

(54) CONTACT FOR SEMICONDUCTOR FABRICATION

(71) Applicant: Taiwan Semiconductor Manufacturing Company, Ltd., Hsin-Chu (TW)

(72) Inventor: Jhon Jhy Liaw, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/516,278

(22) Filed: Oct. 16, 2014

(65) Prior Publication Data

US 2016/0111430 A1    Apr. 21, 2016

(51) Int. Cl.
| | |
|---|---|
| *H01L 27/11* | (2006.01) |
| *H01L 29/45* | (2006.01) |
| *H01L 29/417* | (2006.01) |
| *H01L 29/66* | (2006.01) |
| H01L 27/088 | (2006.01) |
| H01L 21/8234 | (2006.01) |

(52) U.S. Cl.
CPC .... *H01L 27/1104* (2013.01); *H01L 29/41791* (2013.01); *H01L 29/45* (2013.01); *H01L 29/6653* (2013.01); *H01L 29/6681* (2013.01); H01L 21/823431 (2013.01); H01L 21/823475 (2013.01); H01L 27/0886 (2013.01)

(58) Field of Classification Search
CPC ..... H01L 21/823431; H01L 21/823437; H01L 27/1104
USPC ................................. 257/329, 353
See application file for complete search history.

(56) References Cited

U.S. PATENT DOCUMENTS

| | | | | |
|---|---|---|---|---|
| 5,545,584 A | * | 8/1996 | Wuu | H01L 21/76877 257/E21.585 |
| 6,100,569 A | * | 8/2000 | Yeh | H01L 27/11 257/369 |
| 6,512,299 B1 | * | 1/2003 | Noda | H01L 21/76895 257/408 |
| 6,927,461 B2 | * | 8/2005 | Kim | H01L 21/76895 257/377 |
| 2005/0029556 A1 | * | 2/2005 | Wang | G11C 11/412 257/250 |
| 2006/0019488 A1 | * | 1/2006 | Liaw | H01L 27/1104 438/637 |

(Continued)

FOREIGN PATENT DOCUMENTS

| | | |
|---|---|---|
| JP | 3239940 | 12/2001 |
| KR | 1020070109484 | 11/2007 |
| KR | 1020140054358 | 5/2015 |

OTHER PUBLICATIONS

KIPO Office Action, Application No. 10-2014-0182324, dated Dec. 8. 2-15. 5 pgs—Translation, 5 pgs—Korean.

*Primary Examiner* — Kenneth Parker
*Assistant Examiner* — Warren H Kilpatrick
(74) *Attorney, Agent, or Firm* — Haynes and Boone, LLP (57) ABSTRACT

A semiconductor device includes a substrate, a fin structure on the substrate, the fin structure comprising a doped region, a first gate over the fin structure, the first gate positioned adjacent the doped region, the first gate having a spacer on a first side and having no spacer on a second side between the gate and the doped region, and a conductive plug that contacts the doped region and a top of the gate.

20 Claims, 8 Drawing Sheets

(56) References Cited

U.S. PATENT DOCUMENTS

2013/0062701 A1* 3/2013 Lee .................. H01L 29/66545
257/369
2013/0141963 A1* 6/2013 Liaw .................... G11C 11/412
365/156
2015/0041926 A1 2/2015 Pradhan et al.

* cited by examiner

CONTACT FOR SEMICONDUCTOR FABRICATION

BACKGROUND

Integrated circuits include several types of components, particularly transistors. One type of transistor is a Metal Oxide Semiconductor Field Effect Transistor (MOSFET). MOSFET devices include a gate structure on top of a semiconductor substrate. Both sides of the gate structure are then doped to form source and drain regions. A channel is formed between the source and drain regions beneath the gate. Based on the voltage bias applied to the gate, electric current may either be allowed to flow through the channel or be inhibited from doing so.

In some cases, the channel may be formed using a fin structure. The fin structure extends out of the substrate and runs perpendicular to the gate structure formed on the substrate and fin structures. Doped regions, such as source and drain regions are formed in the fin structure on both sides of the gate structure.

To connect the transistor to other components, a conductive contact connects to the source or drain regions. In some cases, a source or drain region is to be connected to an adjacent gate structure. But, due to the narrow width of the fin structure, it can be difficult to get the contact to land on the source or drain region such that there is good electrical contact between the contact and the source or drain region. Thus, it is desirable to improve the contact in such situations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to improve the electrical contact between a doped region (i.e., source or drain region) of a fin-like active region (or a fin structure) with an adjacent gate structure. According to one embodiment of principles described herein, one spacer on the side of a metal replacement gate is removed to allow more room for the butt contact. The butt contact is formed by etching a trench to expose at least a portion of the doped region and the top of the metal replacement gate. The spacer on the side of the metal replacement gate that is adjacent the doped region is then removed. The trench is then filled with a conductive material. Because the spacer is removed, the conductive material makes direct contact with the sidewall of the metal replacement gate and the top of the metal replacement gate. It is understood that while the present example illustrates a metal replacement gate, other examples embodying principles described herein may use other types of gates. Additionally, with the spacer removed, there is a larger exposed portion of the doped region for contact with the conductive material.

Figure 1A:
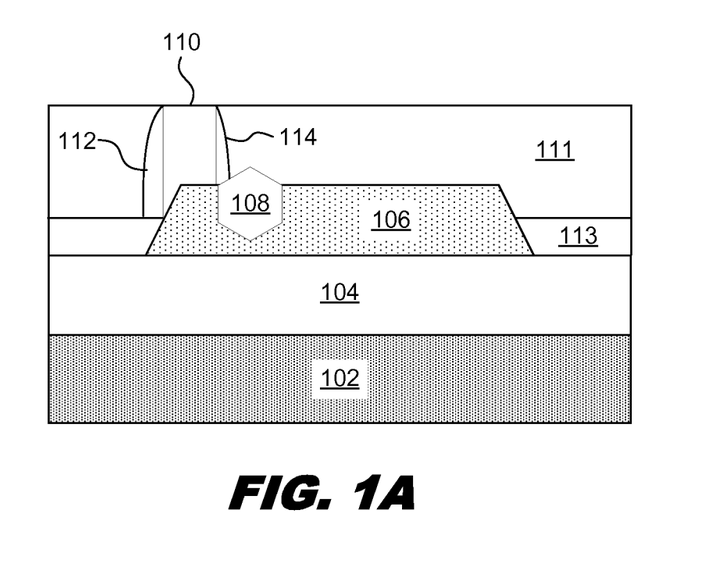
FIGS. 1A-1E are diagrams showing an illustrative process for forming an improved butt contact for a semiconductor device, according to one example of principles described herein.

FIGS. 1A-1E are diagrams showing an illustrative process for forming an improved butt contact for a semiconductor device. FIG. 1A illustrates a substrate 102 having an N-well region 104 formed therein in accordance with some embodiments. A fin-like active region (a fin structure) 106 is formed on the substrate. A doped feature 108 is formed in the fin structure 106. Additionally, a gate stack 110 is formed over the fin structure 106. It is understood that while only a single gate device and a single doped feature 108 is shown for purposes of discussion, a practical implementation of principles described herein would involve several gate devices and doped features to form specifically designed integrated circuits.

The substrate 102 is a semiconductor substrate, such as a semiconductor wafer. The substrate 102 may be made of a semiconductor material such as silicon. In some examples, other materials such as Germanium or III-V semiconductor materials may be used for the substrate 102. The N-well 104 is a portion of the semiconductor substrate that is doped with n-type dopants such as phosphorous and arsenic. As an example, one or more p-type field effect transistor (pFET) is to be formed in the N-well 104. In some embodiments, the N-well 104 is formed in the substrate 102 and is extended to the fin structure 106. In other embodiments, a p-well may be alternatively formed thereon, such as when one or more n-type field effect transistor (nFET) is to be formed in the fin-like active region 106.

The fin structure 106 is a narrow fin that extends from the substrate 102. In some embodiments, the fin structure 106 is surrounded by an isolation structure, such as shallow trench isolation (STI) structure 113. The STI structure 113 includes one or more dielectric material feature that electrically isolates fin structures from other fin structures or other components. In some embodiments, the STI structure is formed by a procedure that includes patterning the substrate to form trenches therein; filling the trenches with one or more dielectric material; and performing a polishing process (such as chemical mechanical polishing or CMP). The fin structure 106 may be formed in a variety of ways. In some embodiments, the fin structure may be formed by a procedure having an epitaxial growth process. In furtherance of the embodiments, STI structures 113 are formed in the substrate; and a semiconductor material is epitaxially grown on the substrate, thereby forming fin-like active region 106. In some other embodiments, the fin structure is formed by a procedure that includes etching the STI. First, STI structures 113 are formed in the substrate; and thereafter, an etching process is applied to selectively etch the STI, thereby fin-like active region is formed since the STI is recessed by the etching.

The doped region 108 is a doped feature of the fin structure 106. In the present embodiment, the doped region 108 acts as a source or drain region for a transistor device. The doped region may be formed by introducing a dopant to the fin structure by a suitable technique, such as ion implantation. In some examples, the doped region is formed by removing a portion of the fin structure and replacing that portion with a doped semiconductor material using an epitaxial process. An epitaxial process involves growing a semiconductor structure on a semiconductor substrate. During the epitaxial process, the regrown semiconductor material may be doped in-situ, for example, with a B11 species of dopant. Other species of dopants may be used as well. The regrown portion may be made of silicon (Si), germanium (Ge), silicon germanium (SiGe), silicon germanium carbon (SiGeC) or a III-V semiconductor material. The doped region may also be made of silicon phosphorous (SiP), silicon carbon (SiC), silicon phosphorous carbon (SiPC), or combination thereof. In the present embodiment, the doped region 108 is formed after the formation of the gate 110.

According to the present example, a dummy gate 110 is formed over the fin structures 106. The dummy gate 110 may be made of a material such polysilicon. According to the present example, sidewall spacers 112, 114 are formed on the edges of the dummy gate 110. The sidewall spacers 112, 114 may be formed using a procedure that includes deposition and anisotropic etching. The sidewall spacers 112, 114 include one or more dielectric material. For example, the sidewall spacers 112, 114, may be made of silicon dioxide ($SiO_2$), silicon oxynitride (SiON), silicon nitride ($S_3N_4$), silicon oxynitride carbon (SiONC) or any combination thereof. The sidewall spacers 112, 114 are designed to stay in place even after the dummy gate 110 is removed, which will be discussed in more detail below.

When forming metal gate structures, a dummy gate is typically formed where the metal gate structure is intended to be. The dummy gate is used because the metal material and/or high k dielectric material used in the metal gate can be damaged by various processes such as the annealing process used to form the doped region. Thus, the dummy gates are formed first and then the doped regions are formed. After the doped regions are formed, the dummy gates can be replaced with metal gate structures.

In some examples, an Interlayer Dielectric (ILD) layer 111 is formed over the dummy gate 110. The ILD layer 111 is a dielectric material that is used to electrically isolate various components formed throughout the integrated circuit. The ILD layer may be deposited and further planarized by a CMP process.

Figure 1B:
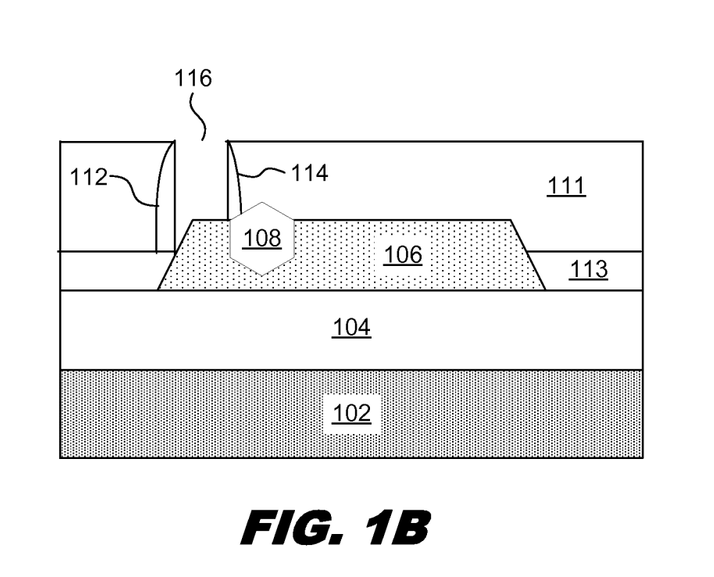

FIG. 1B illustrates removal of the dummy gate 110. In one example, a selective etching process is used to remove the material that forms the dummy gate 110 while leaving the ILD layer 111 substantially intact. After the dummy gate 110 has been removed, a trench 116 exists between the two spacers 112, 114. The trench 116 can then be filled with the materials that form the metal replacement gate.

Figure 1C:
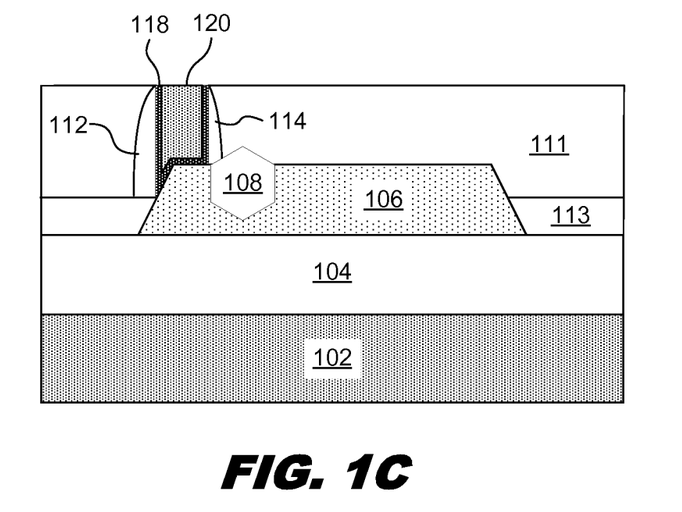

FIG. 1C is a diagram showing formation of a metal replacement gate 120. According to the present example, a high-k dielectric layer 118 is formed within the trench 116. The high-k dielectric layer 118 is commonly used with metal gate structures as gate dielectric between the metal material and the semiconductor material. In another example, the gate dielectric includes an interfacial layer (such as silicon oxide) and a high-k dielectric layer on the interfacial layer.

After the high-k material 118 is in place, the metal replacement gate 120 can then be formed. The metal gate 120 is formed by deposition of a metal material into the trench 116 left by removal of the dummy gates 110. A CMP process may then be used to smooth the surface of the ILD layer 111 and any excess metal material on top of the metal replacement gate 120. The metal material used to form the metal gate 120 may be selected from a variety of appropriate metals such as aluminum, tungsten, copper, silicide, or combination thereof. In some embodiments, the metal gate 120 includes a first metal layer with a suitable work function (referred to as work function metal) and another metal layer (such as aluminum) on the work function metal. The work function metal has a proper work function (such as greater than about 5.2 eV for a pFET) to reduce the threshold voltage of the filed effect transistor and enhance the device performance. In one example, the work function metal for the pFET includes titanium nitride.

Figure 1D:
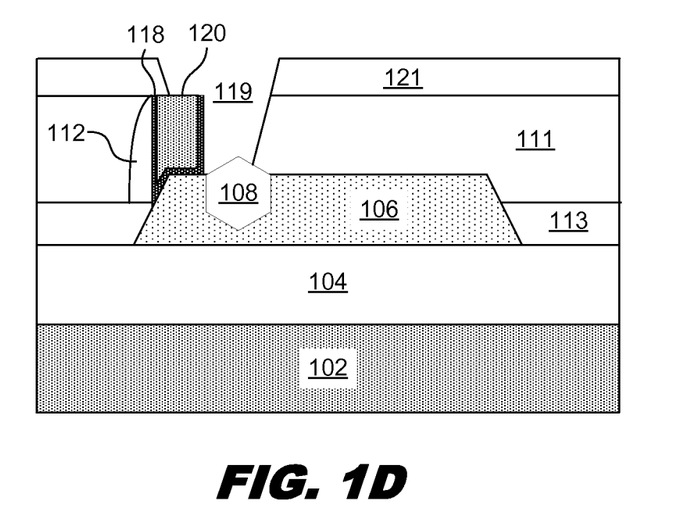

FIG. 1D illustrates formation of an opening (contact hole) 119 for formation of a contact. FIG. 1D also illustrates removal of the spacer 114 from the sidewall of the metal replacement gate. In some examples, a second ILD layer 121 is formed on top of the first ILD layer 111. The second ILD layer covers the metal gate 120.

After the second ILD layer is formed, an opening 119 is formed over the doped region 108 to expose at least a portion of the doped region 108. The opening exposes the top of the metal replacement gate 120 as well. In some examples, the same etching process used to remove the ILD layer 111, 121 is used to remove the spacer 114. For example, the etching technique can be selective such that it removes the ILD and spacer material while leaving the metal replacement gate 120, fin structure 106, and doped region 108 substantially intact. In some examples, however, multiple etching and patterning techniques may be used to form the opening 119 in the ILD 111, 121 and to remove the spacer 114.

In some examples, the same etching process used to remove a hard mask layer is used to remove the spacer layer. The hard mask layer is used during a patterning process. Specifically, the hard mask layer is deposited and then patterned such that holes in the hard mask layer correspond to locations where the openings such as opening 119 are to be formed. The hard mask layer is then removed after the etching process used to form opening 119. Removal of the hard mask layer may also be used to remove the exposed spacer 114.

By removing the spacer 114, the opening 119 has more spatial freedom to align with the doped region 108. The gate 120, however, has an asymmetrical spacer configuration because the spacer 112 on one side remains in the final structure while the spacer 114 on the other side adjacent the doped region 108 is removed.

Figure 1E:
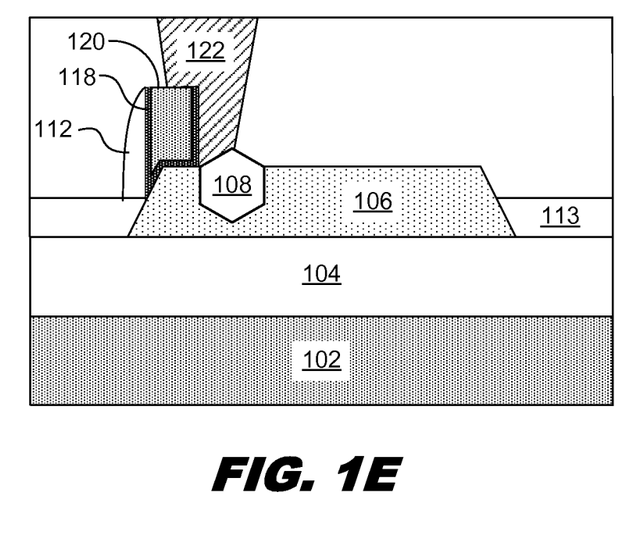

FIG. 1E illustrates formation of a butt contact. According to the present example, a conductive metal is formed in the opening 119 to form the conductive plug 122. The conductive plug 122 forms an electrical contact between the doped region 108 and the replacement metal gate 120. Because the conductive plug 122 butts against the top of the metal replacement gate 120, it is referred to as a butt contact.

Because the spacer 114 has been removed, there is more room for the conductive plug 122 to make electrical contact with the doped region 108. Specifically, removing the spacer 114 exposes more of the doped region 108 that was originally covered by the spacer 114. Thus, there is a better electrical connection between the metal replacement gate 120 and the doped region 108.

The conductive plug 122 may be formed in one of a variety of shapes from a top view perspective. For example, the conductive plug 122 may be elliptical, circular, rectangular, or square from a top view perspective. Other shapes are contemplated as well. The conductive plug 122 may be made from a variety of conductive materials including tungsten (W), titanium nitride (TiN), tantalum nitride (TaN), copper (Cu), titanium (Ti), titanium silicide (TiSi2), titanium tungsten (TiW), cobalt (Co), cobalt silicide (CoSi$_2$), nickel (Ni), nickel silicide (NiSi), platinum (Pt), platinum silicide (PtSi), or combination thereof.

Figure 2:
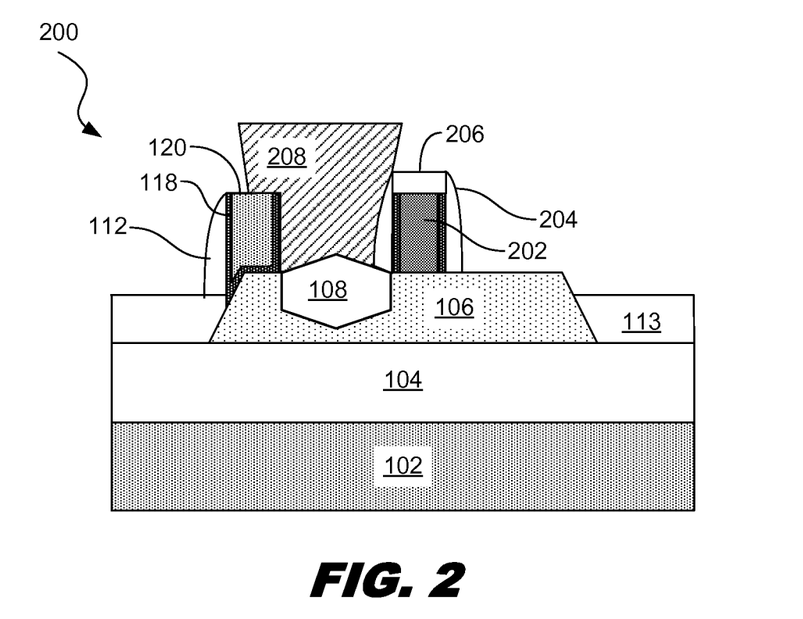
FIG. 2 is a diagram showing an illustrative self-aligned butt contact, according to one example of principles described herein.

FIG. 2 is a diagram showing an illustrative self-aligned butt contact. According to the present example, a second metal replacement gate 202 is formed on the other side of the doped region 108. The second metal replacement gate 202 may be formed during the same process used to form the first metal replacement gate 120. In this example, the second metal replacement gate 202 is not intended to be in electrical connection with the doped region 108. Thus, the second metal replacement 202 has sidewall spacers 204 on both sides that can electrically isolate the metal replacement gate 202 from other features. The metal replacement gate 202 may also have a dielectric cap 206 made from a material such as silicon nitride (SiN).

Because the second metal replacement gate 202 is covered in dielectric material (i.e., the spacers 204 and the cap 206), the conductive plug 208 can extend from the sidewall of the first metal replacement gate 120 to the spacer 204 of the second metal gate without inadvertently creating a short between the conductive plug 208 and the second metal replacement gate 202. This allows for a larger window of error when patterning the conductive plug 208. Thus, the conductive plug 208 is referred to as a self-aligned conductive plug 208. The conductive plug 208 also makes a butt contact with the top of the first metal replacement gate 120. Thus, the conductive plug 208 can also be referred to as a self-aligned butt contact. For purposes of illustration, the ILD layers are not shown in FIG. 2.

Figure 3:
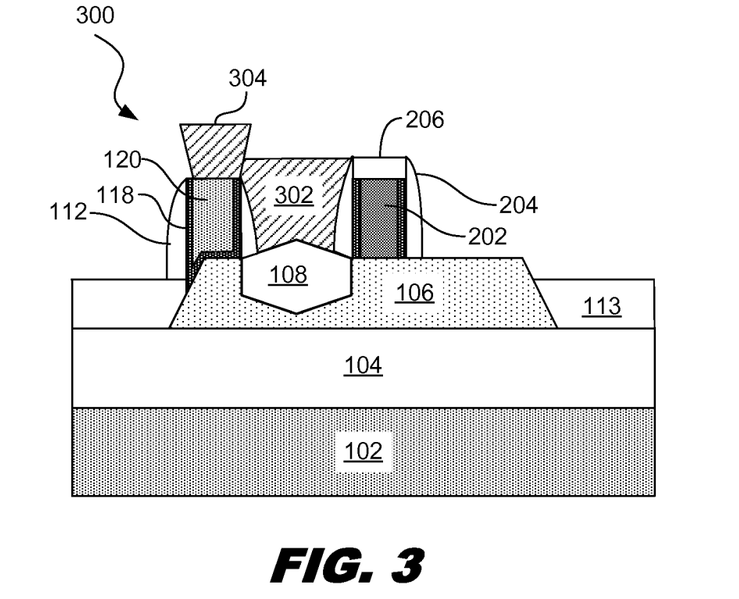
FIG. 3 is a diagram showing an illustrative contact structure comprising a self-aligned contact and a separate butt contact.

FIG. 3 is a diagram showing an illustrative contact structure comprising a self-aligned contact and a separate butt contact. In some examples, two separate conductive plugs 302, 304 are formed. Specifically, a first conductive plug 302 is formed as a self-aligned contact between the first metal replacement gate 120 and the second metal replacement gate 202. Then, a second conductive plug 304 is formed as a butt contact. The first conductive plug 302 and the second conductive plug 304 are in electrical contact so that there is electrical contact between the first metal replacement gate 120 and the doped region 108.

The first metal replacement gate 302 and the second metal replacement gate 202 may be formed using the processes described above. The spacer on the side of the first metal replacement gate adjacent the doped region 108 may or may not be removed. In some examples, an additional ILD layer is formed after the first conductive plug 302 is formed but before the second conductive plug 304 is formed. For purposes of illustration, the ILD layers are not shown in FIG. 3.

Figure 4:
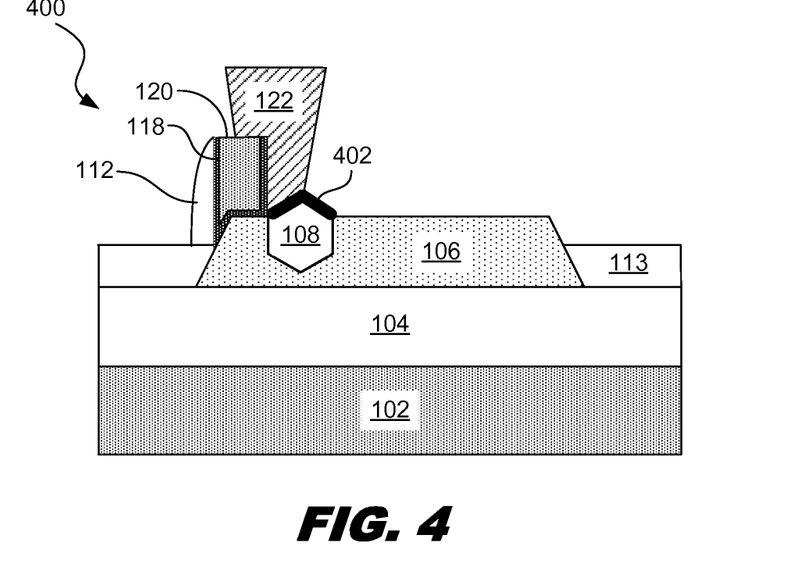
FIG. 4 is a diagram showing an illustrative silicide layer between a butt contact and doped region, according to one example of principles described herein.

FIG. 4 is a diagram showing an illustrative silicide layer between a butt contact and doped region. According to the present example, a silicide layer 402 is formed on the doped region 108 before the conductive plug 122 is formed. The silicide layer 402 allows for better electrical contact between the conductive plug 122 and the doped region 108. The silicide layer 402 may be formed in conjunction with other embodiments described herein. For example, the silicide layer 402 may be used with the self-aligned butt contact described in FIG. 2 or the separate self-aligned and butt contacts described in FIG. 3.

Figure 5:
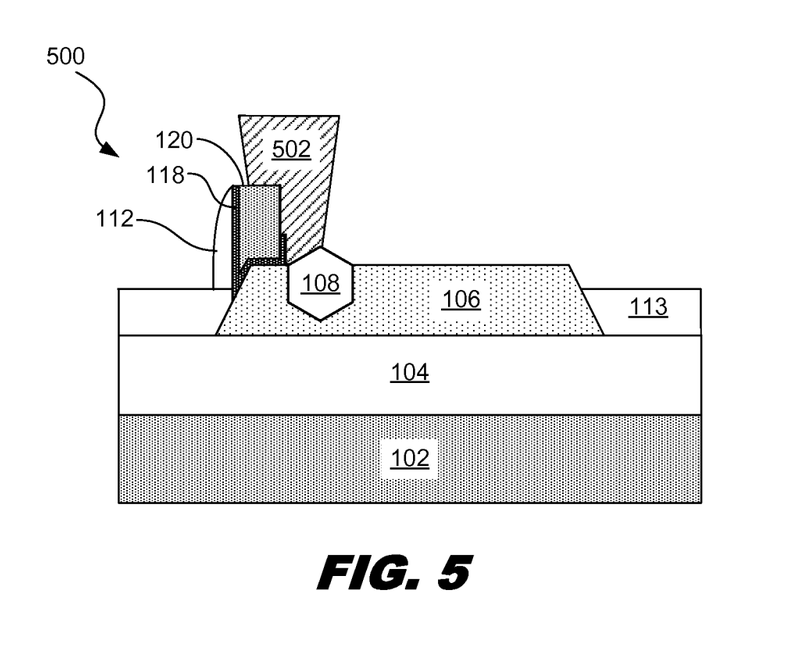
FIG. 5 is a diagram showing an illustrative metal gate with the high-k dielectric layer partially removed, according to one example of principles described herein.

FIG. 5 is a diagram showing an illustrative metal gate with the high-k dielectric layer 118 partially removed. According to the present example, a portion of the high-k dielectric layer 118 may be removed before forming the conductive plug 502. Thus, there is additional direct contact between the conductive plug 502 and the metal replacement gate 120 along the sidewall of the metal replacement gate 120. The high-k dielectric gate may be removed through an etching process after the spacer 114 has been removed. The conductive plug 502 in direct contact with a sidewall of the metal replacement gate 120 may be used in conjunction with other embodiments described herein. For example, the conductive plug 502 in direct contact with a sidewall of the metal replacement gate 1202 may be used with the self-aligned butt contact described in FIG. 2 or the separate self-aligned and butt contacts described in FIG. 3.

The principles described herein may be used to form a variety of devices within an integrated circuit. In one example, the metal replacement gate 120 and other features and embodiments described above may be part of an SRAM cell. The metal replacement gate 120 and other features and embodiments described above may also be used to form other devices commonly found within integrated circuits.

Figure 6A:
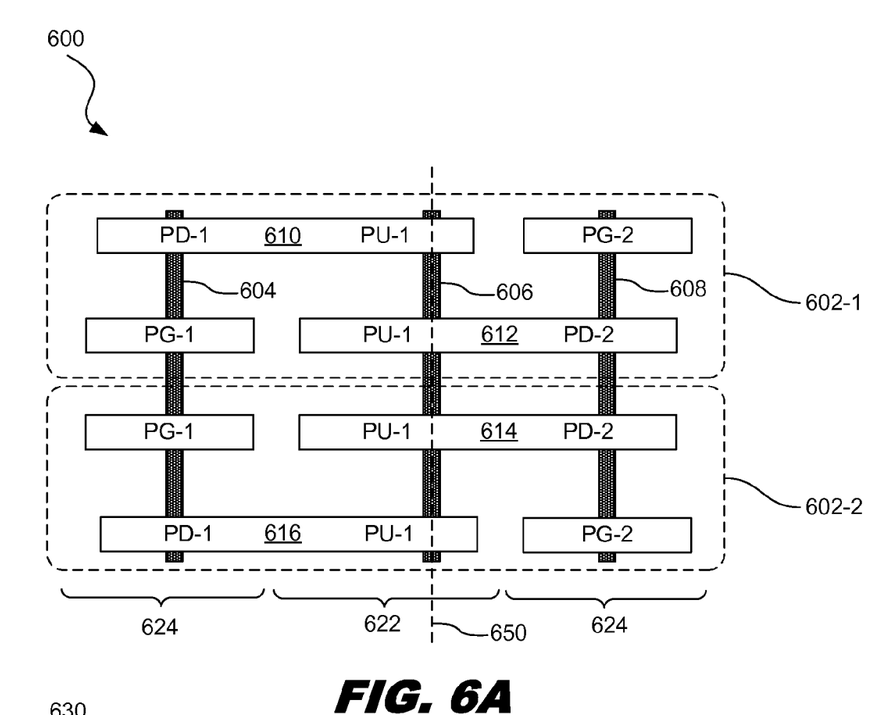
FIG. 6A is a diagram showing a top view of two Static Random Access Memory (SRAM) cells, according to one example of principles described herein.
Figure 6B:
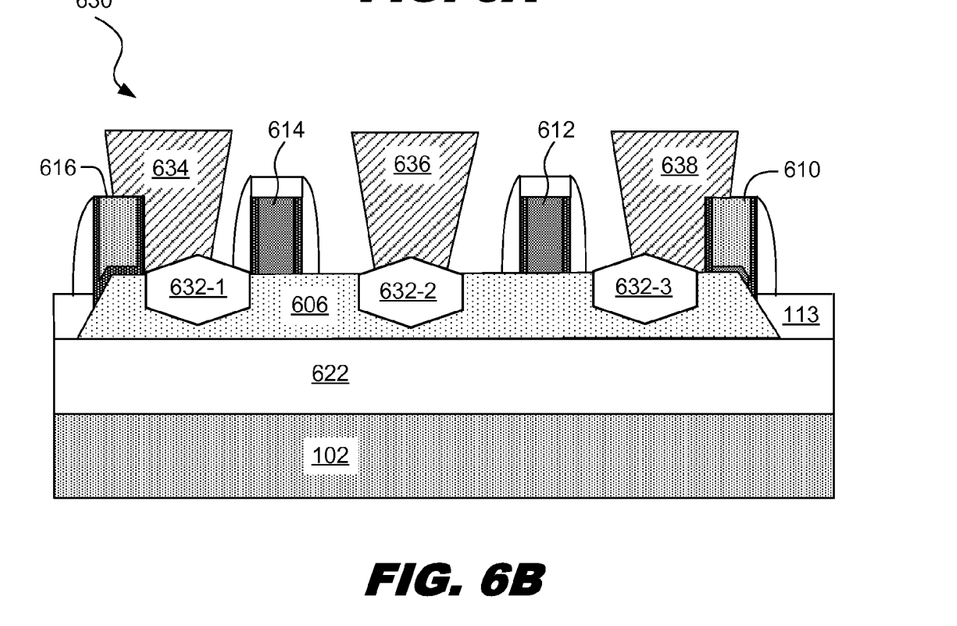
FIG. 6B is a diagram showing a cross-sectional view of the two SRAM cells such that the butt contacts are shown, according to one example of principles described herein.

FIG. 6A is a diagram showing a top view 600 of two SRAM cells 602. SRAM is a type of volatile memory that maintains its state without being periodically refreshed. An SRAM cell typically includes two cross-coupled digital inverters. An inverter includes three transistor devices, referred to as a pass-gate device, a pull-up device, and a pull-down device. The functionality of an SRAM cell and the inverters that make up the SRAM cell is beyond the scope of the present invention. Thus, an explanation of such will not be given here. FIG. 6A illustrates a layout of metal gate structures and fin structures between isolation regions 618 and does not necessarily illustrate how such features are interconnected. FIGS. 6A and 6B do not necessarily illustrate every component that may be formed using principles described herein. Rather, the illustrated elements are shown for purposes of discussion.

The first cell 602-1 includes a metal gate structure 610 that acts as a gate for both a first pull-down device across a first fin structure 604 and a first pull-up device across a second fin structure 606. The first cell 602-1 also includes a second metal gate structure 612 that acts as a gate for both a second pull-up device over the second fin structure 606 and a second pull-down device over a third fin structure 608. The first cell 602-1 also includes a first pass-gate device that is formed over the first fin structure 604 and a second pass-gate device that is formed over the third fin structure 608.

The second cell 602-2 is a mirror image of the first cell 602-1. The second cell 602-2 includes a metal gate structure 616 that acts as a gate for both a first pull-down device across a first fin structure 604 and a first pull-up device across a second fin structure 606. The second cell 602-2 also includes a second metal gate structure 614 that acts as a gate for both a second pull-up device over the second fin structure 606 and a second pull-down device over a third fin structure 608. The second cell 602-2 also includes a first pass-gate device that is formed over the first fin structure 604 and a second pass-gate device that is formed over the third fin structure 608.

The pull-up devices are formed within an N-well 622. The pull-down devices and the pass-gate devices are formed within P-wells 624. The dotted line 650 represents the point at which the cross-sectional view shown in FIG. 6B is taken. The dotted line 650 follows the second fin structure 606 on which the pull-up devices are formed.

FIG. 6B is a diagram showing a cross-sectional view 630 of the two SRAM cells such that the butt contacts are shown. Specifically, a first conductive butt contact 634 is formed to connect doped region 632-1 to the top of the metal gate 616 that forms the first pull-up device of the first cell 602-1. Metal gate 614 corresponds to the second pull-up device of the first cell 602-1. Additionally, a second conductive butt contact 638 is formed to connect doped region 632-3 to the top of the metal gate 610 that corresponds to the first pull-up device of the second cell 602-2. Metal gate 612 corresponds to the second pull-up device of the second cell 602-2. A third conductive plug 636 is used to connect doped region 632-2 to circuitry formed in other layers.

The first conductive plug 634 and second conductive plug 638 form butt contacts with the metal gate 616 and metal gate 610, respectively. The conductive plugs 634, 638 may also be formed in accordance with other embodiments described herein. For example, the conductive plugs 634, 638 may be self-aligned butt contacts as described in the text accompanying FIG. 2. Additionally, the conductive plugs 634, 638 may include two separately formed components as described in the text accompanying FIG. 3. The conductive plugs 634, 638 may include silicide layers and/or partially removed high-k dielectric layers as described in the text accompanying FIGS. 4 and 5 respectively. The features illustrated in FIG. 6B may be formed according to the process described in the text accompanying FIG. 1.

Figure 7A:
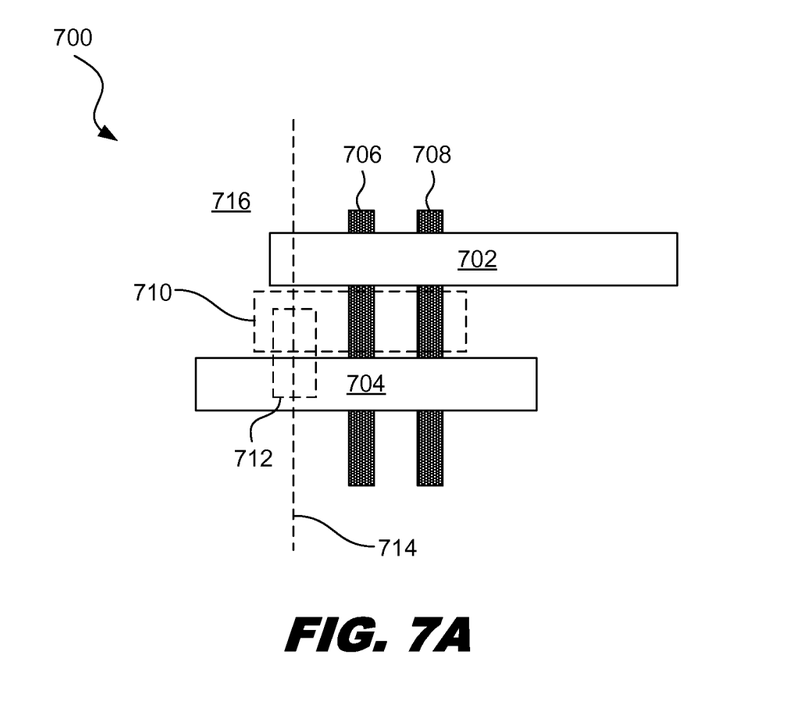
FIG. 7A is a diagram showing a top view of a butt contact that is not aligned with a fin structure, according to one example of principles described herein.

FIG. 7A is a diagram showing a top view of a butt contact that is not aligned with a fin structure. As described above in the text accompanying FIG. 3, a self-aligned contact can be formed separate from the butt contact. In FIG. 3, the butt contact is aligned with the fin structure. In some examples, however, the butt contact can be placed in a position such that it is not aligned with the fin structure. FIG. 7 illustrates two metal gate structures 702, 704 formed over two separate fin structures 706, 708. The self-aligned contact 710 is formed between the two metal gates 702. The butt contact 712, however, is formed such that it makes contact with both the self-aligned contact 710 and the metal gate structure 704 at a point that is not aligned with either fin structure 706, 708.

Figure 7B:
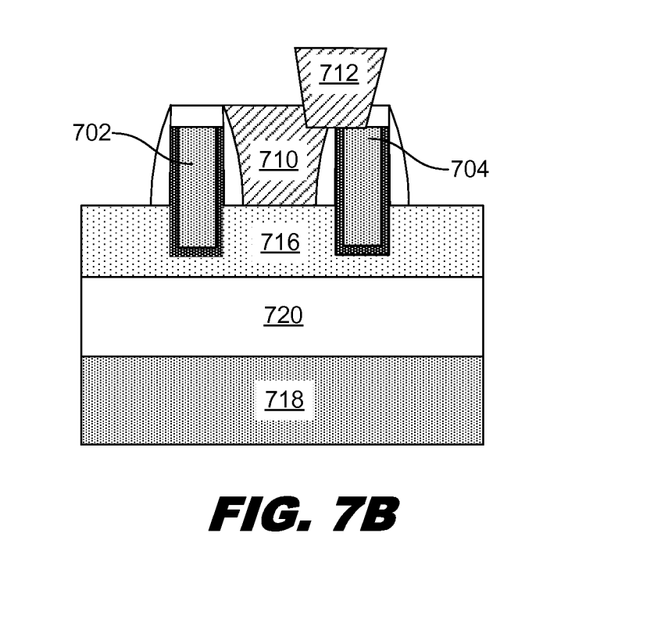
FIG. 7B is a diagram showing an illustrative cross-sectional view of a butt contact that is not aligned with a fin structure, according to one example of principles described herein.

FIG. 7B is a diagram showing an illustrative cross-sectional view of a butt contact that is not aligned with a fin structure. In the present example, the two metal gate structures 702, 704 are formed over an STI region 716. The STI region is formed over an N-well 720 which is formed in a substrate 718.

The self-aligned contact 710 is formed such that it is in direct contact with sidewall spacers formed on each of the metal gate structures 702, 704. The butt contact 712 is formed such that it makes contact with the top of the metal fate 704 and the self-aligned contact. Because the self-aligned contact is also in electrical contact with the fin structures 706, 708, the metal gate 704 is also in electrical contact with the fin structures 706, 708, or doped regions (not shown) within the fin structures 706, 708.

Figure 8:
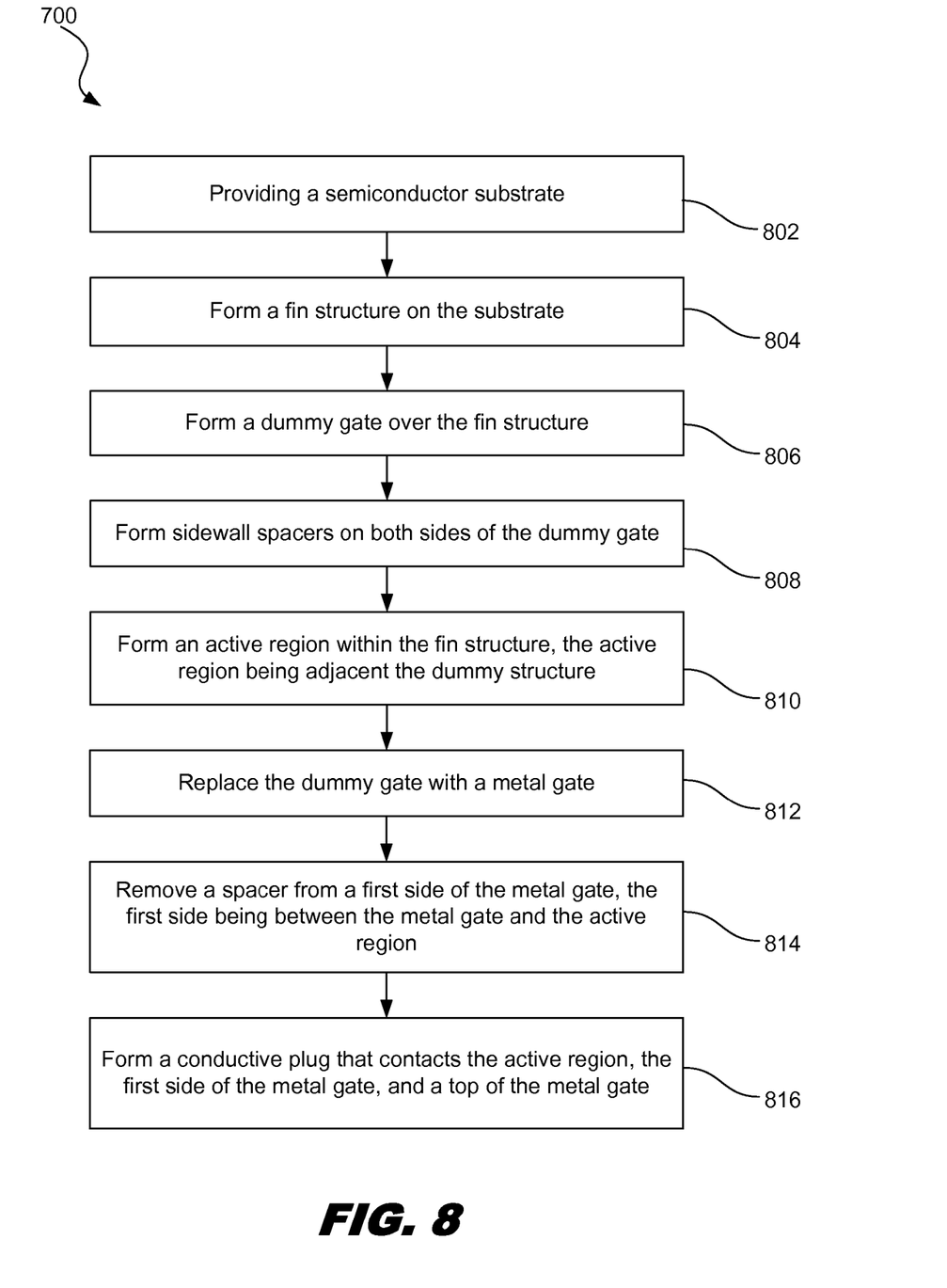
FIG. 8 is a flowchart showing an illustrative method for forming an improved butt contact, according to one example of principles described herein.

FIG. 8 is a flowchart showing an illustrative method 800 for forming an improved butt contact. The following flowchart does not necessarily illustrate every step used in a process to form the structures embodying principles described herein. Other steps involving According to the present example, the method 800 includes a step 802 for providing a semiconductor substrate. The substrate may be a standard semiconductor wafer. The substrate may also have an N-well that is formed therein.

The method 800 further includes a step 804 for forming a fin structure on the substrate. The fin structure may be surrounded by Shallow Trench Isolation (STI) regions. The fin structure can be used as a channel for multiple MOSFET devices.

The method 800 further includes a step 806 for forming a dummy gate over the fin structure. The dummy gate may be made of a material such as polysilicon. The dummy gate is a temporary structure that will eventually be replaced with a metal replacement gate. The dummy gate is used because subsequent processes, such as those to form the source or drain regions, may damage the metal material of a metal replacement gate.

The method 800 further includes a step 808 for forming sidewall spacers on both sides of the dummy gate. The sidewall spacers may be formed using a deposition process. The sidewall spacers may be a dielectric material. The spacers are used in part to form a temporary structure in which to replace the dummy gate with the metal replacement gate.

The method 800 further includes a step 810 for forming a doped region within the fin structure. The doped region is formed adjacent the dummy structure. The doped region may be formed by etching a portion of the fin structure where the doped region is to be formed. Then, an epitaxial process can be used to grow the doped region within the etched portion of the fin structure. The regrown portion of the fin structure can be doped to act as a source or drain region.

The method 800 further includes a step 812 for replacing the dummy gate with the metal replacement gate. This is done by removing the dummy gate through an etching process that is selective to the dummy gate material. This leaves a trench between the two spacers. Then, a high-k dielectric layer is formed along the bottom and sidewalls of the trench. Then a metal material is formed within the trench over the high-k dielectric layer.

The method 800 further includes a step 814 for removing a spacer from one side of the metal replacement gate. Specifically, the spacer between the metal replacement gate and the doped region is removed. This may be done through an etching process. In some examples, removing the spacer is done in the same process used to remove a portion of the ILD layer. The portion of the ILD layer is the portion in which the contact is to be formed.

The method 800 further includes a step 816 for forming a conductive plug that contacts the doped region, the sidewall of the metal replacement gate, and the top of the metal replacement gate. The conductive plug thus forms a butt contact with the top of the metal replacement gate. The conductive plug provides an electrical connection between the metal replacement gate and the doped region.

According to one example, a semiconductor device includes a substrate, a fin structure on the substrate, the fin structure comprising a doped region, a first gate over the fin structure, the first gate positioned adjacent the doped region, the first gate having a spacer on a first side and having no spacer on a second side between the gate and the doped region, and a conductive plug that contacts the doped region and a top of the gate.

According to one example, a semiconductor device includes a substrate, a fin structure formed on the substrate, the fin structure comprising a doped region, a first gate on a first side of the doped region, the first gate having sidewall spacers on both sides, a second gate on a second side of the doped region, the second side being opposite the first side, the second gate having spacers on both sides, a self-aligned contact between the first gate and the second gate, and a butt contact that is in direct connection with a top of the first gate and the self-aligned contact.

According to one example, a method for forming a semiconductor device includes providing a substrate, forming a fin structure on the substrate, forming a dummy gate over the fin structure, forming sidewall spacers on both sides of the dummy gate, forming a doped region within the fin structure, the doped region being formed adjacent the dummy gate, replacing the dummy gate with a gate, removing a spacer from a first side of the gate, the first side being between the gate and the doped region, and forming a conductive plug that contacts the doped region, the first side of the gate, and a top of the gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a fin structure on the substrate, the fin structure comprising a doped region;
   a first gate over the fin structure, the first gate positioned adjacent the doped region, the first gate having a spacer on a first side and having no spacer on a second side between the gate and the doped region, the first gate including a gate dielectric layer disposed over the fin structure and a gate electrode disposed over the gate dielectric layer and physically contacting the gate dielectric layer, the gate dielectric layer extending along opposing sidewalls of the gate electrode towards a top of the first gate without extending to the top of the first gate on the second side of the first gate; and
   a conductive plug that physically contacts the doped region, the gate dielectric layer, one of the sidewalls of the gate electrode and the top of the first gate.

2. The device of claim 1, wherein the first gate comprises a metal replacement gate.

3. The device of claim 2, wherein the gate dielectric layer includes a high-k dielectric layer physically contacting the fin structure directly under the gate electrode and extending along.

4. The device of claim 1, further comprising, a second gate positioned adjacent the doped region opposite the first gate, the second gate having spacers on both sides.

5. The device of claim 3, wherein the conductive plug extends to a spacer of the second gate.

6. The device of claim 3, wherein the first gate and second gate are pull-up transistors of a Static Random Access Memory (SRAM) cell.

7. The device of claim 1, wherein the doped region comprises a doped epitaxial region.

8. The device of claim 1, further comprising a silicide layer formed on the doped region between the doped region and the conductive plug.

9. The device of claim 1, wherein the first gate is positioned at a longitudinal end of the fin structure.

10. The device of claim 1, wherein the fin structure is formed over an N-well in the substrate.

11. The device of claim 10, wherein the first gate is an elongated gate that serves as a gate to a pull-up device over the N-well and a pull-down device formed over a P-well in the substrate.

12. A semiconductor device comprising:
    a substrate;
    a fin structure formed on the substrate, the fin structure comprising a doped region;
    a first gate on a first side of the doped region, the first gate including a gate dielectric layer disposed over the fin structure and a gate electrode disposed over the gate dielectric layer and physically contacting the gate dielectric layer, the gate dielectric layer extending along opposing sidewalls of the gate electrode towards a top of the first gate;
    a second gate on a second side of the doped region, the second side being opposite the first side, the second gate having spacers on both sides;
    a self-aligned contact between the first gate and the second gate, the self-aligned contact physically contacting the gate dielectric layer and one of the sidewalls of the gate electrode; and
    a butt contact that is in direct connection with the top of the first gate and the self-aligned contact.

13. The device of claim 12, wherein the butt contact is in direct contact with the top of the self-aligned contact.

14. The device of claim 12, wherein the top of the self-aligned contact is at a different height than a top of the first gate.

15. The device of claim 12, wherein the self-aligned contact is in direct contact with one of the spacers from the second gate.

16. The device of claim 12, further comprising, a silicide layer between the doped region and the self-aligned contact.

17. The device of claim 12, wherein the gate dielectric layer includes a high-k dielectric layer physically contacting the fin structure directly under the gate electrode.

18. A method for forming a semiconductor device, the method comprising:
   providing a substrate;
   forming a fin structure on the substrate;
   forming a dummy gate over the fin structure;
   forming sidewall spacers on both sides of the dummy gate;
   forming a doped region within the fin structure, the doped region being formed adjacent the dummy gate;
   replacing the dummy gate with a gate, the gate including a gate dielectric layer and metal gate electrode disposed over the gate dielectric layer and physically contacting the gate dielectric layer, the gate dielectric layer extending along opposing sidewalls of the metal gate electrode towards a top of the gate;
   removing a spacer from a first side of the gate to expose the gate dielectric layer, the first side being between the gate and the doped region;
   removing a portion of the gate dielectric layer to expose one of the sidewalls of the metal gate electrode; and
   forming a conductive plug that physically contacts the doped region, the gate dielectric layer, the one of the sidewalls of the metal gate electrode, and a top of the gate.

19. The method of claim 18, further comprising, forming a second gate adjacent the doped region opposite the first gate, the second gate comprising spacers on both sides, wherein the conductive plug extends to one of the spacers of the second gate.

20. The method of claim 18, further comprising forming a shallow trench isolation feature in the substrate, and
   wherein forming sidewall spacers on both sides of the dummy gate includes forming the spacer directly on the fin structure such that the spacer physically contacts the fin structure and forming another spacer on a second side of the dummy gate such that the another spacer physically contacts the shallow trench isolation feature.

* * * * *